(12) United States Patent
Yang et al.

(10) Patent No.: US 10,707,086 B2
(45) Date of Patent: Jul. 7, 2020

(54) ETCHING METHODS

(71) Applicant: Applied Materials, Inc., Santa Clara, CA (US)

(72) Inventors: Yang Yang, Los Gatos, CA (US); Kartik Ramaswamy, San Jose, CA (US); Kenneth S. Collins, San Jose, CA (US); Steven Lane, Portersville, CA (US); Gonzalo Monroy, San Francisco, CA (US); Lucy Zhiping Chen, Santa Clara, CA (US); Yue Guo, Redwood City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/239,170

(22) Filed: Jan. 3, 2019

(65) Prior Publication Data

US 2019/0221437 A1 Jul. 18, 2019

Related U.S. Application Data

(60) Provisional application No. 62/618,834, filed on Jan. 18, 2018.

(51) Int. Cl.
*H01L 21/3065* (2006.01)
*H01J 37/32* (2006.01)
(Continued)

(52) U.S. Cl.
CPC ...... *H01L 21/3065* (2013.01); *H01J 37/3056* (2013.01); *H01J 37/3255* (2013.01); *H01J 37/32091* (2013.01); *H01J 37/32715* (2013.01); *H01L 21/67069* (2013.01); *H01L 21/6831* (2013.01); *H01J 37/32449* (2013.01); *H01J 2237/002* (2013.01); *H01J 2237/006* (2013.01); *H01J 2237/3174* (2013.01); *H01J 2237/327* (2013.01); *H01J 2237/3341* (2013.01)

(58) Field of Classification Search
None
See application file for complete search history.

(56) References Cited

U.S. PATENT DOCUMENTS 7,569,484 B2  8/2009 Rueger et al.
7,879,730 B2  2/2011 Naser-Ghodsi et al.
(Continued)

OTHER PUBLICATIONS

Yoshida, Hideto et al., "Electron beam induced etching of carbon nanotubes enhanced by secondary electrons in oxygen", IOP Publishing, Apr. 18, 2017, pp. 1-6.
(Continued)

*Primary Examiner* — Shamim Ahmed
(74) *Attorney, Agent, or Firm* — Patterson + Sheridan, LLP

(57) ABSTRACT

Embodiments described herein relate to apparatus and methods for performing electron beam reactive plasma etching (EBRPE). In one embodiment, an apparatus for performing EBRPE processes includes an electrode formed from a material having a high secondary electron emission coefficient. In another embodiment, methods for etching a substrate include generating a plasma and bombarding an electrode with ions from the plasma to cause the electrode to emit electrons. The electrons are accelerated toward a substrate to induce etching of the substrate.

20 Claims, 6 Drawing Sheets

(51) Int. Cl.
    *H01L 21/683*    (2006.01)
    *H01J 37/305*    (2006.01)
    *H01L 21/67*     (2006.01)

(56) References Cited

U.S. PATENT DOCUMENTS

| | | |
|---|---|---|
| 8,642,478 B2 * | 2/2014 | Ooya ............... H01J 37/32091 |
| | | 438/706 |
| 9,023,666 B2 | 5/2015 | Auth et al. |
| 9,288,890 B1 | 3/2016 | Chen et al. |
| 2001/0045527 A1 | 11/2001 | Wissman et al. |
| 2007/0113981 A1 * | 5/2007 | Brcka ................... H01J 37/321 |
| | | 156/345.48 |
| 2009/0288603 A1 | 11/2009 | Rueger et al. |
| 2010/0264111 A1 | 10/2010 | Makarov |
| 2013/0248356 A1 | 9/2013 | Rue |
| 2016/0020068 A1 | 1/2016 | Martin et al. |
| 2016/0064232 A1 | 3/2016 | Berry, III et al. |
| 2017/0372899 A1 * | 12/2017 | Yang ........................ C01B 32/25 |
| 2019/0088519 A1 * | 3/2019 | Cho .................... H01L 21/6833 |

OTHER PUBLICATIONS

Roediger, P. et al., "Focused electron beam induced etching of silicon using chlorine", IOP Publishing, Jun. 28, 2010, pp. 1-12.
S. J. Randolph et al, "Focused Electron-beam-induced Etching of Silicon Oxide", J. Appl. Phys., 034902, 98, 2005 (Date Accessed Feb. 6, 2019).
International Search Report and Written Opinion for International Application No. PCT/US2019/012099 dated Apr. 30, 2019.

* cited by examiner

ETCHING METHODS

CROSS-REFERENCE TO RELATED APPLICATIONS

This application claims benefit of U.S. Provisional Patent Application No. 62/618,834, filed Jan. 18, 2018, the entirety of which is herein incorporated by reference.

BACKGROUND

Field

Embodiments of the present disclosure generally relate to methods and apparatus for etching a substrate. More specifically, embodiments described herein relate to methods and apparatus for electron beam reactive plasma etching.

Description of the Related Art

In the semiconductor manufacturing industry, various technological advances have enabled production of increasingly complex devices at advanced technology nodes. For example, device feature sizes have been reduced to the nanometer scale and the geometric complexity of such features has grown increasingly complex. Etching processes used to fabricate such devices are often a limiting factor in further development of advanced devices.

Reactive ion etching (RIE) is a conventional etching technique which utilizes ion bombardment to induce etching reactions on a substrate. With RIE, it is possible to generate anisotropic etching profiles; however, certain ion energy thresholds are often necessary to induce desired etching reactions and to control the etching profile. The ion energy thresholds often reduce etch selectivity and may damage the structure being etched.

Electron beams are another technology commonly used in the semiconductor manufacturing industry. Electrons beams, when utilized with suitable etching gas chemistries, can induce etching on a substrate. However, conventional electron beam etching apparatus typically emit an electron beam with a cross section on the micrometer scale, which is not practical for forming nanometer scale advanced devices.

Thus what is needed in the art are improved etching apparatus and methods.

SUMMARY

In one embodiment, a method of etching a substrate is provided. The method includes delivering a process gas to a process volume of a process chamber, applying low frequency RF power to an electrode formed from a high secondary electron emission coefficient material disposed in the process volume, and generating a plasma comprising ions in the process volume. The electrode is bombarded with the ions to cause the electrode to emit electrons and form an electron beam, the emitted electrons are accelerated from the electrode through the plasma toward a substrate, and the substrate is etched.

In another embodiment, a method of etching a substrate is provided. The method includes positioning a substrate on a pedestal disposed in a process volume of a process chamber, biasing the pedestal, delivering a process gas to the process volume, and applying low frequency RF power to an electrode disposed in the process volume opposite the pedestal. The process gas is energized to form a plasma in the process volume, the electrode is biased, ions are accelerated from the plasma toward the electrode, and an electron beam is generated from electrons emitted from the electrode.

In yet another embodiment, a method of etching a substrate is provided. The method includes positioning a substrate on a pedestal disposed in a process volume of a process chamber, electrostatically chucking the substrate to the pedestal, and maintaining the pedestal at ground potential. A process gas is delivered to the process volume, RF power with a frequency of about 2 MHz is applied to an electrode disposed in the process volume opposite the pedestal, and the process gas is energized to form a plasma in the process volume. The electrode is biased, ions are accelerated from the plasma toward the electrode, and an electron beam is generated from electrons emitted from the electrode.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to apparatus and methods for performing electron beam reactive plasma etching (EBRPE). In one embodiment, an apparatus for performing EBRPE processes includes an electrode formed from a material having a high secondary electron emission coefficient. In another embodiment, methods for etching a substrate include generating a plasma and bombarding an electrode with ions from the plasma to cause the electrode to emit electrons. The electrons are accelerated toward a substrate to induce etching of the substrate.

Figure 1:
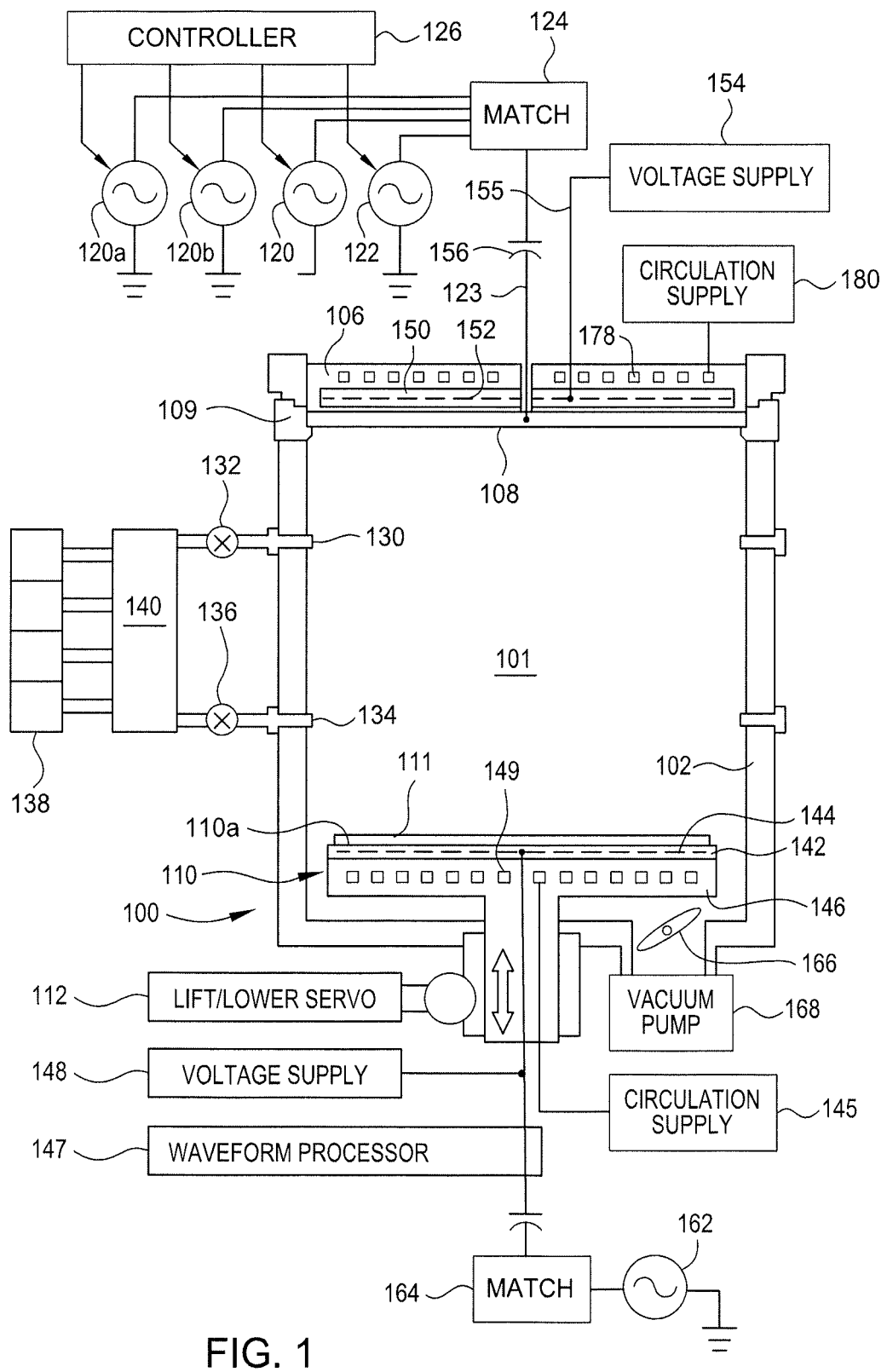
FIG. 1 schematically illustrates an electron beam reactive plasma etching (EBRPE) apparatus according to an embodiment described herein.

FIG. 1 schematically illustrates an electron beam reactive plasma etching (EBRPE) chamber 100. The chamber 100 has a chamber body 102 which defines a process volume 101. In one embodiment, the chamber body 102 has a substantially cylindrical shape. In other embodiments, the chamber body 102 has a polygonal shape, such as a cubic shape or the like. The chamber body 102 is fabricated from a material suitable for maintaining a vacuum pressure environment therein, such as metallic materials, for example aluminum or stainless steel.

A ceiling 106 is coupled to the chamber body 102 and further defines the process volume 101. In one embodiment, the ceiling 106 is formed from an electrically conductive material, such as the materials utilized to fabricate the chamber body 102. The ceiling 106 is coupled to and supports an electrode 108 thereon. In one embodiment, the electrode 108 is coupled to the ceiling 106 such that the electrode 108 is disposed adjacent the process volume 101. In one embodiment, the electrode 108 is formed from a process-compatible material having a high secondary electron emission coefficient, such as silicon, carbon, silicon carbon materials, or silicon-oxide materials. Alternatively, the electrode 108 is formed from a metal oxide material such as aluminum oxide, yttrium oxide, or zirconium oxide. A dielectric ring 109, which is formed from an electrically insulating material, is coupled to the chamber body 102 and surrounds the electrode 108. As illustrated, the dielectric ring 109 is disposed between the chamber body 102 and the ceiling 106 and supports the electrode 108 thereon.

A pedestal 110 is disposed in the process volume 101. The pedestal 110 supports a substrate 111 thereon and has a substrate support surface 110a oriented parallel to the electrode 108. In one embodiment, the pedestal 110 is movable in the axial direction by a lift servo 112. During operation, a substrate support surface 110a is maintained at a distance of between about 1 inch and about 30 inches from the top electrode 108. In one embodiment, the pedestal 110 includes an insulating puck 142 which forms the substrate support surface 110a, an electrode 144 disposed inside the insulating puck 142, and a chucking voltage supply 148 connected to the electrode 144. Additionally, a base layer 146 underlying the insulating puck 142 has internal passages 149 for circulating a thermal transfer medium (e.g., a liquid) from a circulation supply 145. In one embodiment, the circulation supply 145 functions as a heat sink. In another embodiment, the circulation supply 145 functions as a heat source. In one embodiment, a temperature of the pedestal 110 is maintained between about −20° C. and about 1000° C.

An RF power generator 120 having a VHF frequency (e.g., 160 MHz) and a lower frequency RF power generator 122 having a frequency below the VHF range or below the HF range (e.g., in the MF or LF range, e.g., between about 100 kHz and about 60 MHz, such as about 2 MHz) are coupled to the electrode 108 through an impedance match 124 via an RF feed conductor 123. In one embodiment, the impedance match 124 is adapted to provide an impedance match at the different frequencies of the RF power generators 120 and 122, as well as filtering to isolate the power generators from one another. Output power levels of the RF power generators 120, 122 are independently controlled by a controller 126. As will be described in detail below, power from the RF power generators 120, 122 is coupled to the electrode 108.

In one embodiment, the ceiling 106 is electrically conductive and is in electrical contact with the electrode 108. Power from the impedance match 124 is conducted through the ceiling 106 to the electrode 108. In one embodiment, the chamber body 102 is maintained at ground potential. In one embodiment, grounded internal surfaces (i.e. chamber body 102) inside the chamber 100 are coated with a process compatible material such as silicon, carbon, silicon carbon materials, or silicon-oxide materials. In an alternative embodiment, grounded internal surfaces inside the chamber 100 are coated with a material such as aluminum oxide, yttrium oxide, or zirconium oxide.

In one embodiment, the RF power generator 120 is replaced by two VHF power generators 120a and 120b that are separately controlled. The VHF power generator 120a has an output frequency in a lower portion (e.g., 30 MHz to 150 MHz) of the VHF band, while the VHF power generator 120b has an output frequency in an upper portion (e.g., 150 MHz to 300 MHz) of the VHF band. The controller 126 governs plasma ion density by selecting the ratio between the output power levels of the VHF power generators 120a and 120b.

With the two VHF power generators 120a and 120b, radial plasma uniformity in the process volume 101 can be controlled by selecting a distance between the electrode 108 and pedestal 110. In this embodiment, the lower VHF frequency produces an edge-high radial distribution of plasma ion density in the process volume 101 and the upper VHF frequency produces a center-high radial distribution of plasma ion density. With such a selection, the power levels of the two VHF power generators 120a, 120b are capable of generating a plasma with a substantially uniform radial plasma ion density.

In one embodiment, the ceiling 106 is a support for the electrode 108 and includes an insulating layer 150 containing a chucking electrode 152 facing the electrode 108. A D.C. chucking voltage supply 154 is coupled to the chucking electrode 152 via the feed conductor 155, for electrostatically clamping the electrode 108 to the ceiling 106. A D.C. blocking capacitor 156 is connected in series with the output of the impedance match 124. The controller 126 functions to control the D.C. chucking voltage supply 154. In one embodiment, the RF feed conductor 123 from the impedance match 124 is connected to the electrode support or ceiling 106 rather than being directly connected to the electrode 108. In such an embodiment, RF power from the RF feed conductor 123 is capacitively coupled from the electrode support to the electrode 108.

In one embodiment, internal passages 178 for conducting a thermally conductive liquid or media inside the ceiling 106 are connected to a thermal media circulation supply 180. The thermal media circulation supply 180 acts as a heat sink or a heat source. The mechanical contact between the electrode 108 and the ceiling 106 is sufficient to maintain high thermal conductance between the electrode 108 and the ceiling 106. In the embodiment of FIG. 1, the force of the mechanical contact is regulated by the electrostatic clamping force provided by the D.C. chucking voltage supply 154.

In one embodiment, upper gas injectors 130 provide process gas into the process volume 101 through a first valve 132. In one embodiment, lower gas injectors 134 provide process gas into the process volume 101 through a second valve 136. The upper gas injectors 130 and the lower gas injectors 134 are disposed in sidewalls of the chamber body 102. Gas is supplied from an array of process gas supplies 138 through an array of valves 140 which may include the first and second valves 132 and 136. In one embodiment, gas species and gas flow rates delivered into the process volume 101 are independently controllable. For example, gas flow through the upper gas injectors 130 may be different from gas flow through the lower gas injectors 134. The controller 126 governs the array of valves 140.

In one embodiment, an inert gas, such as argon or helium, is supplied into the process volume 101 through the upper gas injectors 130 and a process gas is supplied into the process volume 101 through the lower gas injectors 134. In this embodiment, the inert gas delivered to the process volume 101 adjacent the electrode 108 functions to buffer the electrode 108 from a reactive plasma formed in the process volume 101, thus increasing the useful life of the electrode 108. In another embodiment, process gas is supplied to the process volume 101 through both the upper gas injectors 130 and the lower gas injectors 134.

In one embodiment, plasma is generated in the process volume 101 by various bulk and surface processes, for example, by capacitive coupling. In one embodiment, plasma generation is also facilitated by energetic ion bombardment of the interior surface of the top electron-emitting electrode 108. In one example, the electrode 108 is biased with a substantially negative charge, such as by application of voltage form the voltage supply 154. In one embodiment, bias power applied to the electrode 108 is between about 1 KW and about 10 KW with a frequency of between about 400 kHz and about 200 MHz. It is believed that ions generated by a capacitively coupled plasma are influenced by an electric field that encourages bombardment of the electrode 108 by the ions generated from the plasma.

The ion bombardment energy of the electrode 108 and the plasma density are functions of both RF power generators 120 and 122. The ion bombardment energy of the electrode 108 is substantially controlled by the lower frequency power from the RF power generator 122 and the plasma density in the process volume 101 is substantially controlled (enhanced) by the VHF power from the RF power generator 120. It is believed that ion bombardment of the electrode 108 causes the electrode to emit secondary electrons. Energetic secondary electrons, which have a negative charge, are emitted from the interior surface of the electrode 108 and accelerated away from the electrode due to the negative bias of the electrode 108.

The flux of energetic electrons from the emitting surface of the electrode 108 is believed to be an electron beam, and may be oriented substantially perpendicular to the interior surface of the electrode 108. A beam energy of the electron beam is approximately equal to the ion bombardment energy of the electrode 108, which typically can range from about 10 eV to 20,000 eV. In one embodiment, the plasma potential is greater than the potential of the electrode 108 and the energetic secondary electrons emitted from the electrode 108 are further accelerated by a sheath voltage of the plasma as the secondary electrons traverse through the plasma.

At least a portion of the electron beam, comprised of the secondary electron flux emitted from electrode 108 due to energetic ion bombardment of the electrode surface, propagates through the process volume 101 and reacts with process gases near the substrate 111. With utilization of suitable process gases, such as chlorine containing materials, fluorine containing materials, bromine containing materials, oxygen containing materials, and the like, the electron beam induces etching reactions on the substrate 111. It is believed that the electron beams, in addition to the capacitively generated plasma, generate chemically reactive radicals and ions which adsorb to the surface of the substrate and form a chemically reactive polymer layer of the surface of the substrate 111. The electron beam bombardment of the chemically reactive polymer layer causes generation of volatile products which results in etching (material removal) of the substrate 111

Accordingly, the electron beam induces chemical reactions to liberate gas phase volatile products and etch the substrate 111. Etching of the substrate 111 is also influenced by other factors, such as pressure. In one embodiment, a pressure maintained in the process volume 101 during electron beam etching of the substrate 111 is between about 0.001 Torr and about 10 Torr. The pressure is generated by a vacuum pump 168 which is in fluid communication with the process volume 101. The pressure is regulated by a gate valve which is disposed between the process volume 101 and the vacuum pump 168.

In one embodiment, an RF bias power generator 162 is coupled through an impedance match 164 to the electrode 144 of the pedestal 110. In a further embodiment, a waveform tailoring processor 147 may be connected between the output of the impedance match 164 and the electrode 144. The waveform tailoring processor 147 changes the waveform produced by the RF bias power generator 162 to a desired waveform. The ion energy of plasma near the substrate 111 is controlled by the waveform tailoring processor 147. In one embodiment, the waveform tailoring processor 147 produces a waveform in which the amplitude is held during a certain portion of each RF cycle at a level corresponding to a desired ion energy level. The controller 126 controls the waveform tailoring processor 147.

Figure 2:
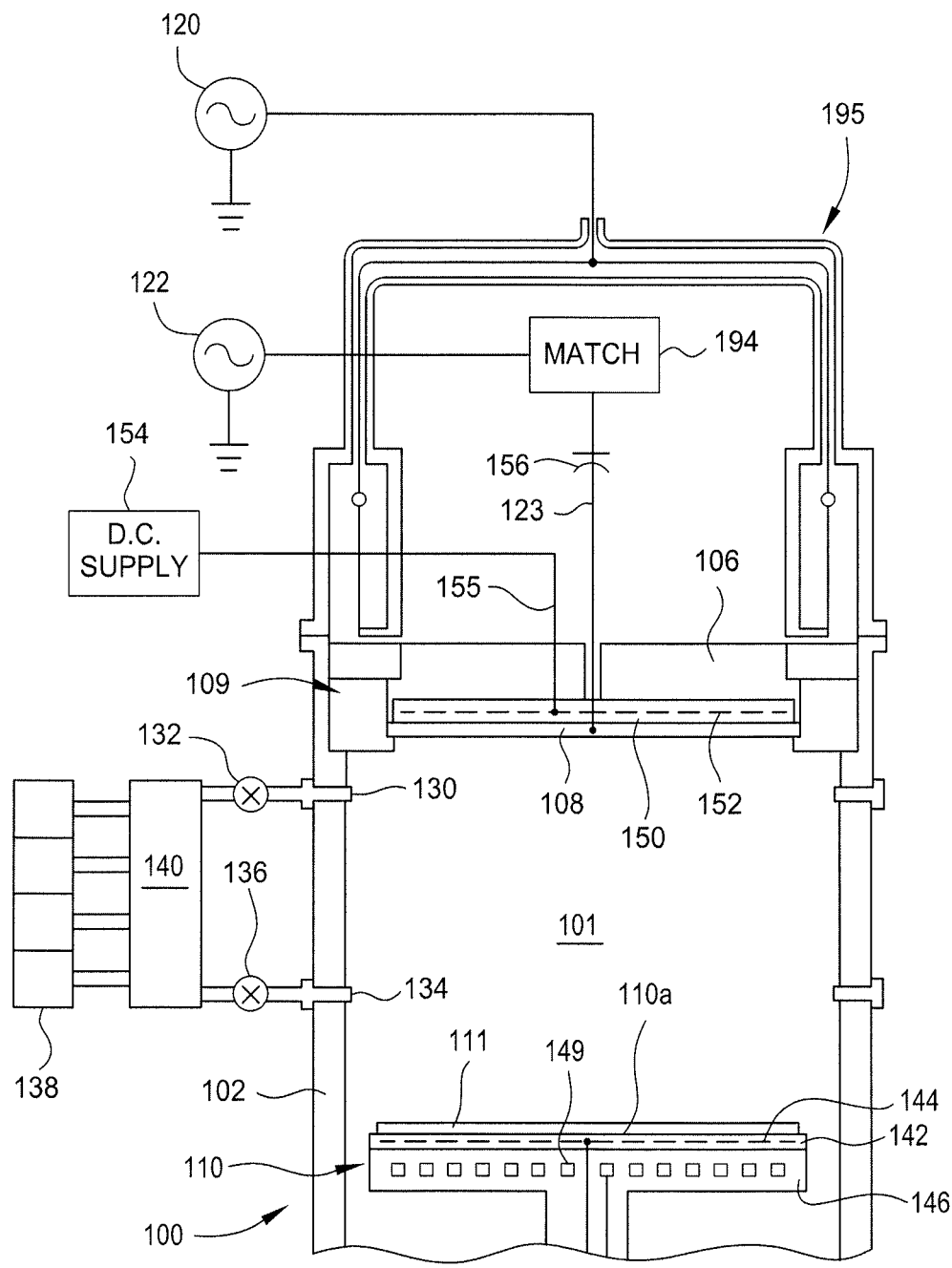
FIG. 2 schematically illustrates an EBRPE apparatus according to an embodiment described herein.

FIG. 2 schematically illustrates another embodiment of the EBRPE apparatus 100. In the embodiment of FIG. 1, the VHF power (from the RF power generator 120) and the lower frequency RF power (from the RF power generator 122) are delivered to the electrode 108 through separate paths. In the embodiment of FIG. 2, the RF power generator 120 is coupled to the electrode 108 through a folded resonator 195 overlying an edge of the electrode 108. The lower frequency RF power generator 122 is coupled to the electrode 108 via the RF feed conductor 123 through an RF impedance match 194. The D.C. chucking voltage supply 154 is coupled to the chucking electrode 152 through the feed conductor 155 extending through a passage in the ceiling 106.

Figure 3:
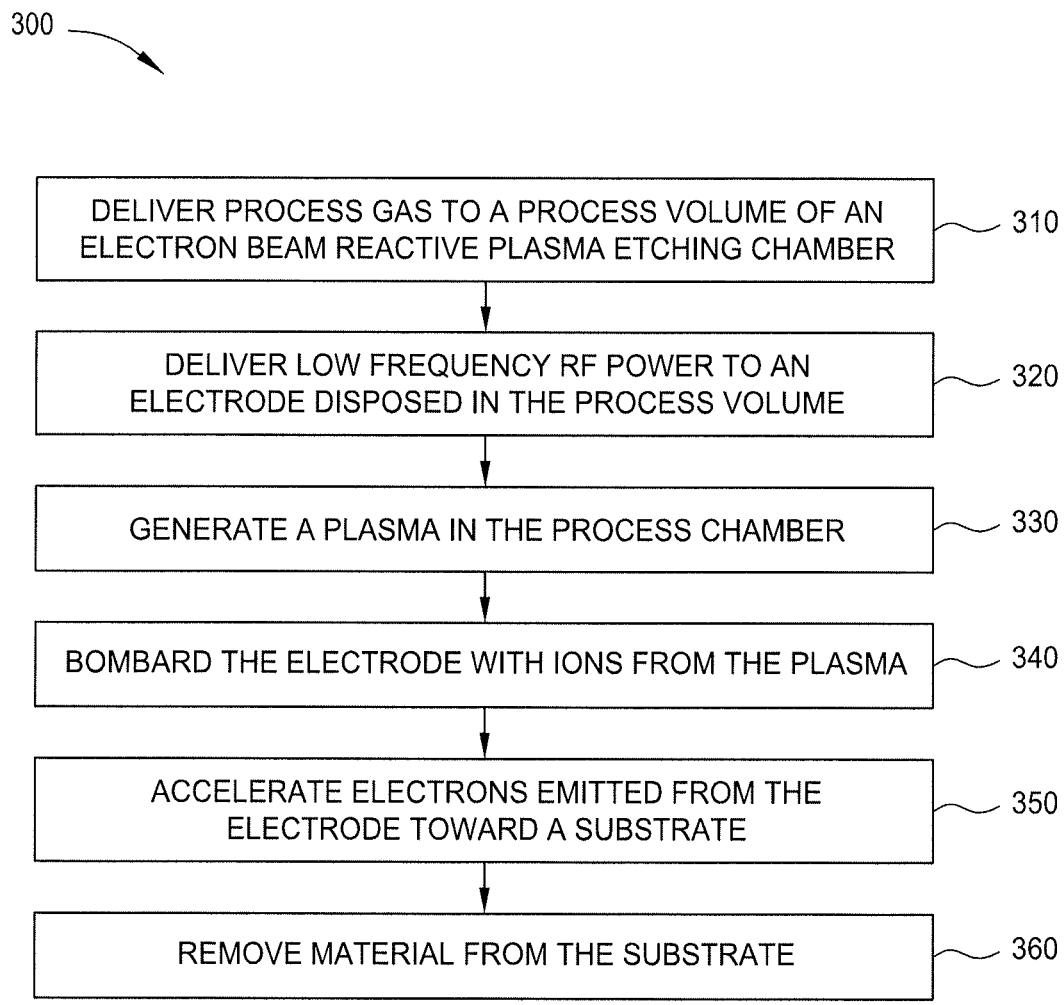
FIG. 3 is a flow chart depicting operations of a method according to an embodiment described herein.

FIG. 3 is a flow chart depicting operations of a method 300 according to an embodiment described herein. At operation 310, a process gas is delivered to a process volume of an EBRPE chamber, such as the process volume 101 of the apparatus 100. Various process gases, such as halogen containing gases or oxygen containing gases, are delivered to the process volume 101 through the gas injectors 130, 134 from the supplies 138. In one embodiment, an inert gas is also delivered to the process volume 101. In this embodiment, the inert gas is delivered through the upper gas injectors 130. Although not illustrated with regard to FIG. 1, in another embodiment, the inert gas is delivered through the top electrode 108. By injecting an inert gas, it is possible to reduce the probability of reactive species back diffusion and better maintain an integrity of a plasma formed in the process volume.

At operation 320, low frequency RF power is delivered to an electrode disposed in the process volume. In one embodiment, RF power having a frequency of about 2 MHz or about 13.56 MHz is applied to the top electrode 108. In one embodiment, the RF power is applied to the top electrode 108 in a pulsed manner. In another embodiment, the RF power is applied to the top electrode 108 continuously. The RF power applied to the top electrode 108 functions to energize the process gases in the process volume 101 and form a plasma in operation 330. By utilizing low frequency RF power, it is possible to generate a plasma with a high sheath voltage, which facilitates acceleration of electrons subsequently emitted from the top electrode 108.

In one embodiment, the pedestal 110 is maintained at ground potential. In another embodiment, low frequency RF power is applied to the pedestal 110. In this embodiment, the RF power applied to the pedestal 110 is concurrent with RF power applied to the electrode 108. Alternatively, the RF power applied to the pedestal 110 is delivered when substantially no RF power is applied to the electrode 108. In embodiments where RF power is applied to the pedestal 110, the RF power is controlled to reduce adverse influence on the plasma sheath potential to prevent retardation of electron beams from reaching the substrate 111.

It is also contemplated that the RF power applied to the top electrode 108 can be synchronized with the RF power applied to the pedestal 110 by pulsing such that the duty cycles of the top electrode RF power and the pedestal 110 RF power do not overlap. As a result, electrical biasing within the process volume 101 is not substantially limited and retardation of electron beams due to plasma sheath bias potential is substantially mitigated.

At operation 340, the electrode is bombarded with ions from the plasma. In this embodiment, the plasma has a predominantly positive charge and the top electrode 108 has a predominantly negative charge. Ions from the plasma are influenced by an electric field generated in the process volume 101 and the ions which are accelerated toward the top electrode 108 heat the top electrode 108. Because the top electrode is formed from a material having a high secondary electron emission coefficient, the ion bombardment of the top electrode 108 causes electrons to be emitted from the top electrode 108.

At operation 350, electrons emitted from the electrode are accelerated toward a substrate. For example, electrons emitted from the top electrode 108 are accelerated toward the substrate 111. Due the substantially negative charge of the top electrode 108, the negatively charged electrons are repelled by the top electrode 108 and toward the substrate 111. It is also contemplated that the plasma sheath voltage potential further functions to accelerate the electrons toward the substrate 111. As the electrons are accelerated by the plasma sheath voltage, the electrons acquire energy of between about 100 electron volts (eV) and about 10,000 eV upon entry into the plasma. The electrons emitted from the top electrode 108 generate a large area secondary electron beam. The electron beam has an energy distribution which is substantially uniform across a diameter of the substrate 111.

At operation 360, material is removed from the substrate. The electrons in the electron beam are believed to react with the process gases to further generate additional radicals and ions which adsorb to surfaces of the substrate 111. The adsorbed materials form a chemically reactive polymer layer on surfaces of the substrate. The electron beam also facilitates polymer layer reaction with the substrate 111 to generate gas phase volatile products, thereby etching the surface of the substrate 111.

Figure 4:
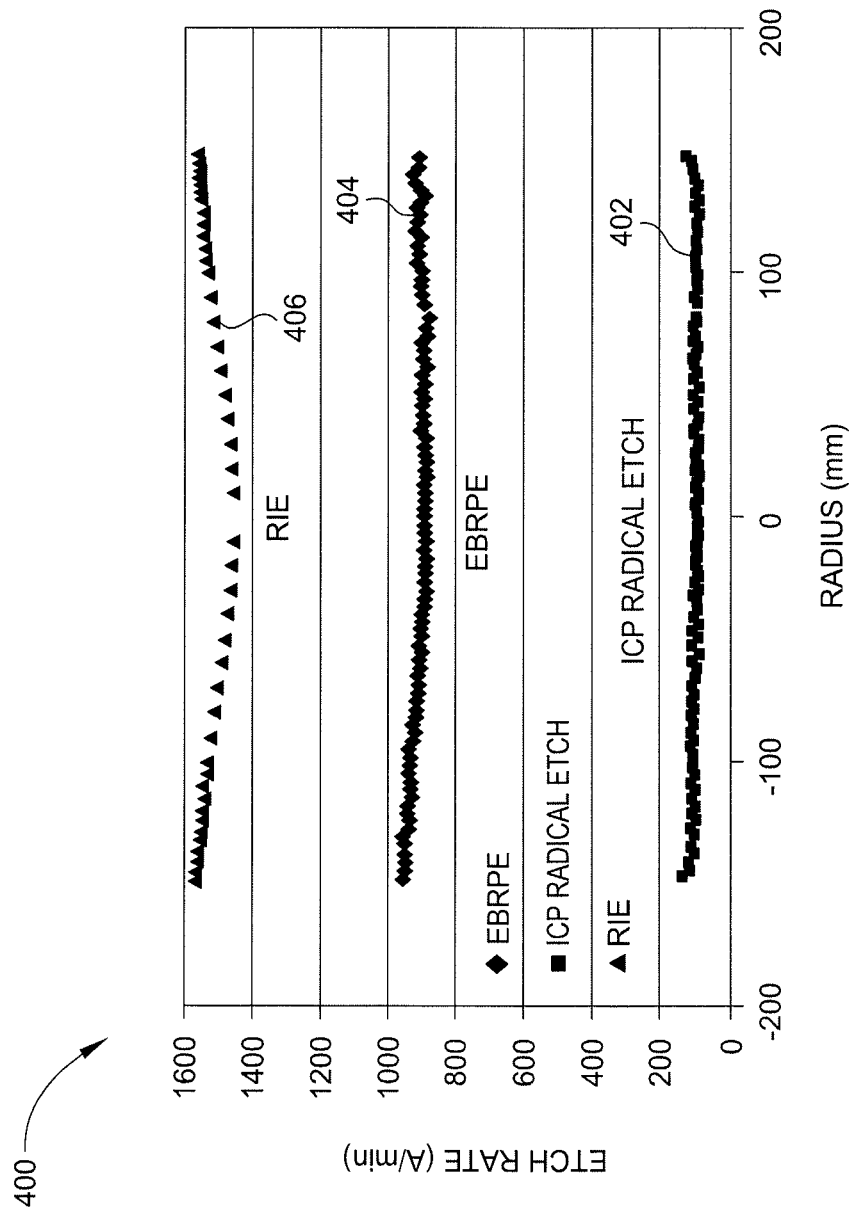
FIG. 4 is a graph illustrating EBRPE etching rates compared to reactive ion etching (RIE) and inductively coupled plasma (ICP) etch rates according to an embodiment described herein.

FIG. 4 is a graph 400 illustrating EBRPE etching rates compared to reactive ion etching (RIE) and inductively coupled plasma (ICP) etch rates according to an embodiment described herein. Etch rate data 402 for an ICP etching regime, etch rate data 406 for an RIE etching regime, and etch rate data 404 for an EBRPE regime illustrate etch rates typical of a blanket etch process when no bias is applied to the substrate. As illustrated, the ICP etch rate data 402 illustrates an etch rate of less than 200 Å/min. The RIE etch data 406 is illustrative of a 30 MHz high power etch regime. While the etch rate data 406 indicates etch rates of greater than about 1400 Å/min, the etch uniformity across a diameter of the substrate exhibits substantial variation. The EBRPE etch rate data 404 illustrates substantially uniform etch rates of greater than about 800 Å/min across a diameter of the substrate. Accordingly, it can be seen that EBRPE etching processes provide for improved etching uniformity at elevated etch rates.

Figure 5:
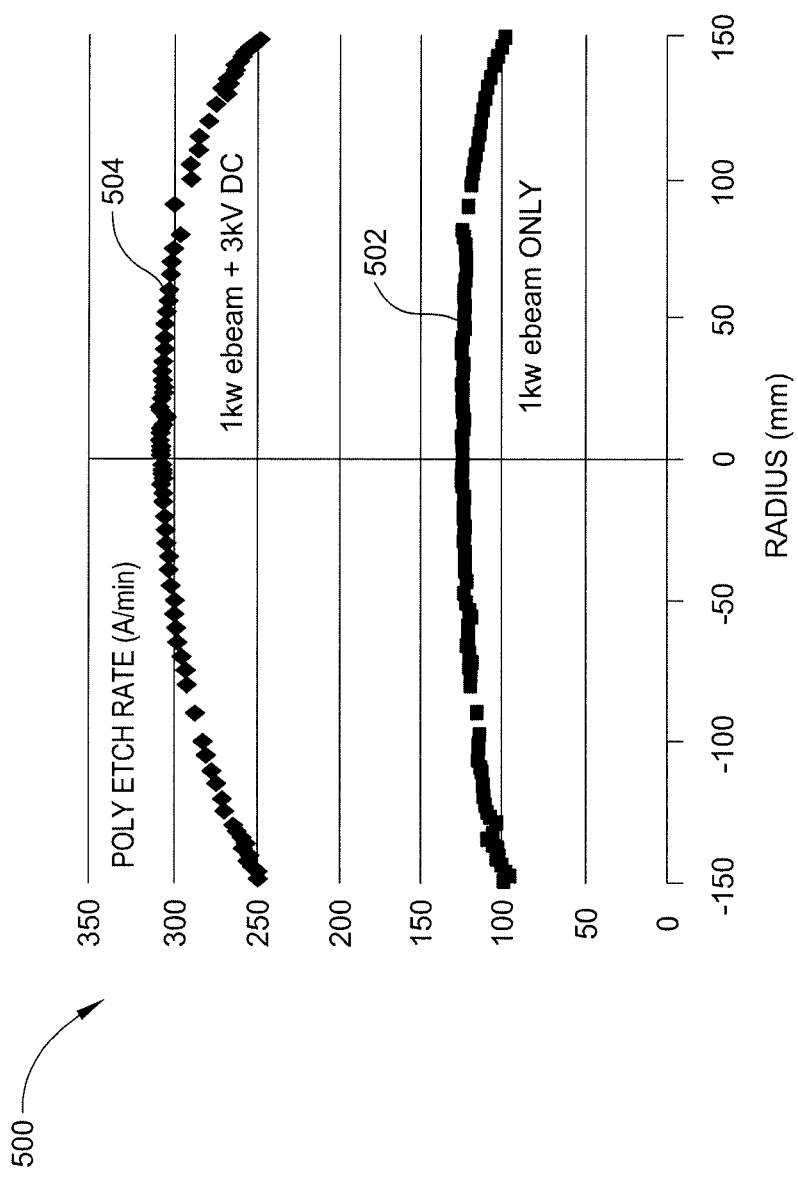
FIG. 5 is a graph illustrating EBRPE etching rates with varying amounts of source power according to an embodiment described herein.

FIG. 5 is a graph 500 illustrating EBRPE etching rates with varying amounts of source power according to an embodiment described herein. Data 502, 504 illustrates a polysilicon etch rate as a function of substrate radius with a 1 kW electron beam source power (502) and with a 1 kW electron beam source power and an additional 3 kV of DC negative voltage (504). Both data 502, 504 illustrate polysilicon etch rates utilizing an argon and chlorine gas mixture in a 7 mTorr pressure environment.

In one embodiment, the 3 kV of DC negative voltage is applied to the top electrode 108. As illustrated, data 502 represents an etch rate of between about 100 Å/min and about 150 Å/min. With 1 kW of electron beam source power, the peak electron beam energy is above 3 kV which is alone sufficient to induce etching reactions on a substrate. However, data 504 which includes an additional 3 kV of DC negative voltage increases the etch rate (by increasing electron beam energy) to about 300 Å/min. Thus, it is believed that by providing additional DC negative voltage to the top electrode 108 that etch rates can be increased. As a result, a more efficient etching process may be achieved.

Figure 6:
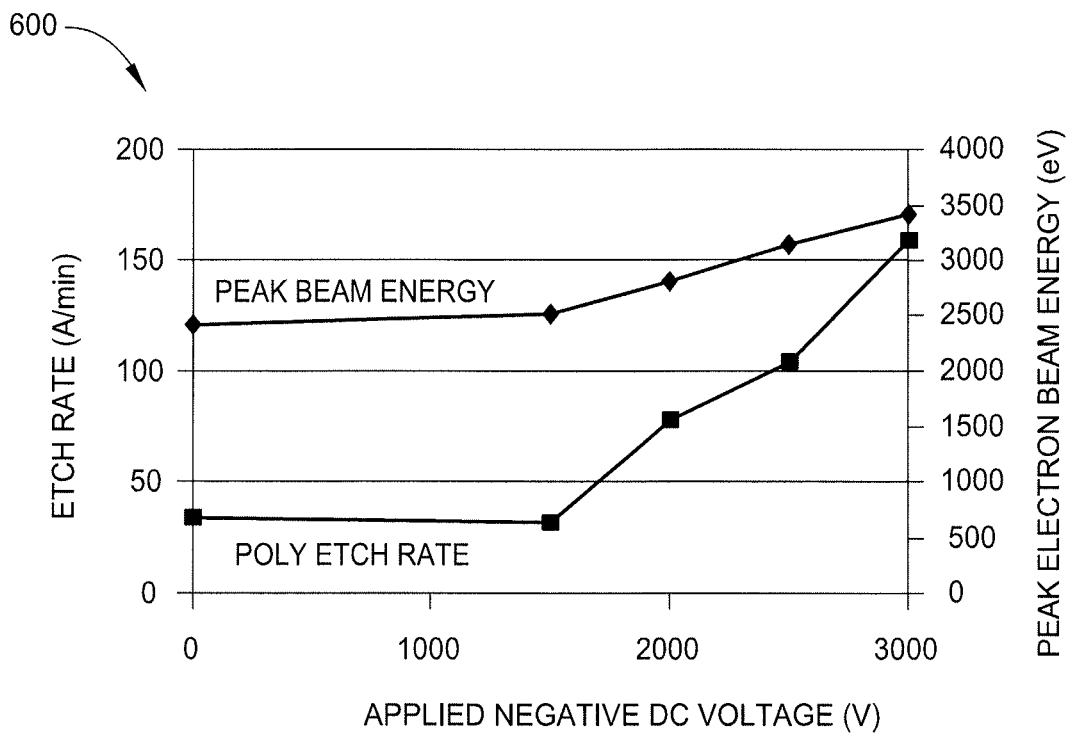
FIG. 6 is a graph illustrating EBRPE etch rates according to an embodiment described herein.

FIG. 6 is a graph 600 illustrating EBRPE etch rates according to an embodiment described herein. More specifically, the graph 600 illustrates a polysilicon etch rate and peak electron beam energy as a function of applied DC negative voltage. The etch rate of polysilicon was obtained using an argon and chlorine gas mixture in a 7 mTorr pressure environment with an electron beam source power of 500 W. Peak beam energy refers to the maximum of the electron beam energy during one RF cycle as the beam energy is RF modulated. Without any additional applied voltage, the etch rate is comparable to conventional radical etch regimes.

As described above, additional DC negative voltage may be applied to the top electrode 108 in certain embodiments. In these embodiments, the electron beam energy is increased by the amount of applied DC negative voltage with negligible effects on beam flux as the electron production is dominated by the RF source. The electron beam source power is relatively low, such as about 500 W, which results in the initial beam energy not being great enough to induce etching reactions. The applied DC negative bias is believed to increase the electron beam energy which results in an increase in etch rate with increasing DC negative voltage.

In one embodiment, a DC negative voltage of 2 kV is applied to the top electrode 108 which causes an increase in electron beam energy sufficient to induce etching reactions. In one embodiment, the applied DC negative voltage is between 2.5 kV and about 3 kV. Thus, increased electron beam energy is realized from the application of DC negative voltage and resulting etch rate increases may be achieved.

Figure 7:
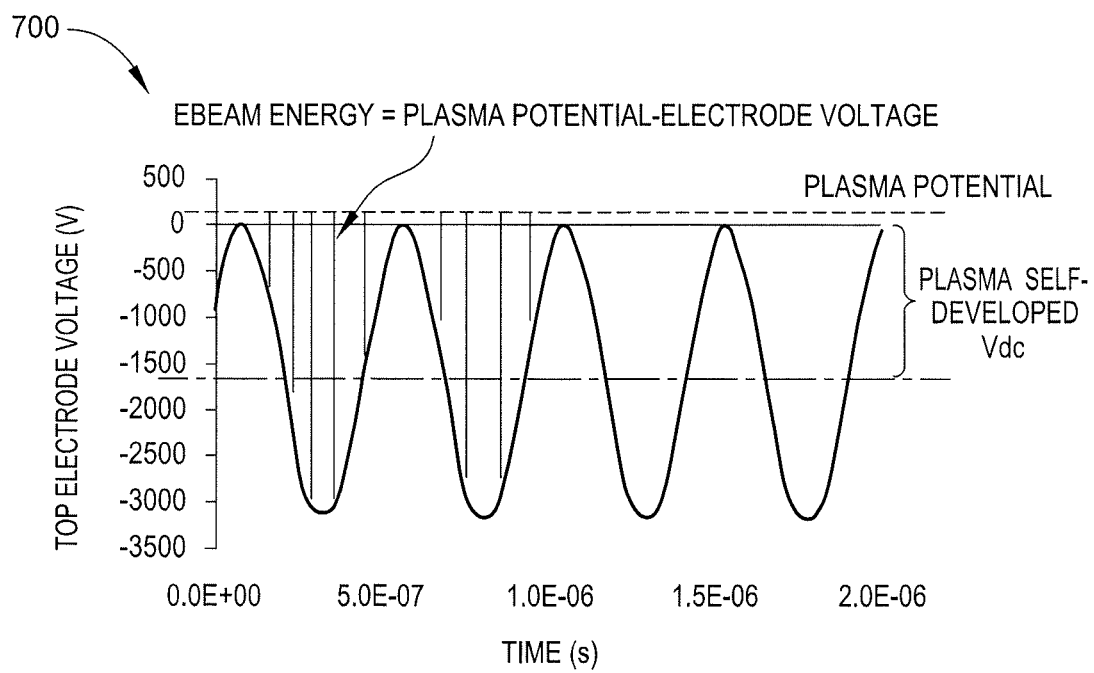
FIG. 7 illustrates data representative of a top electrode voltage waveform and electron beam energy according to an embodiment described herein.

FIG. 7 illustrates data 700 representative of a top electrode voltage waveform and electron beam energy according to an embodiment described herein. In addition to the application of DC negative voltage to the top electrode to increase electron beam power as described above, a baseline negative voltage is believed to develop on the top electrode 108 as a result of the ground area (e.g. pedestal 110) being larger than the electrode area (e.g. top electrode 108). As the electron beam is accelerated by the top plasma sheath, the acquired energy by the electron beam after travelling across the plasma sheath is about equal to the difference between the top electrode voltage and the plasma voltage. In certain embodiments, acceleration of the electron beam by the plasma sheath is sufficient to induce etching reactions. In other embodiments as described above, additional DC negative voltage is applied to increase the power of the electron beam which results in an increased etch rate.

By utilizing electron beams generated in accordance with the embodiments described above, reactive species which are not readily obtained with conventional etching processes may be generated. For example, reactive species with high ionization and/or excitation/dissociation energies may be obtained with the EBRPE methods and apparatus described herein. It is also believed that the EBRPE methods described herein provide for etching rates equivalent to or greater than conventional etching processes, but with improved material selectivity.

For example, EBRPE methods are believed to provide improved etch selectivity due to the separation of threshold electron beam energies used to induce etching reactions. For example, with certain polymerizing gas chemistries, the threshold energy utilized to etch silicon oxide materials is much greater than the threshold energy utilized to etch silicon. As a result, it is possible to achieve etch selectivities of about 5:1 or greater. In one embodiment, EBRPE is believed to enable about 5:1 silicon:silicon oxide etch selectivity. In another embodiment, EBRPE is believed to enable about 5:1 tungsten:silicon nitride etch selectivity.

The kinetic energy of electrons is also much less than that of ions. As a result, substrate damage is reduced because the potential for sputtering is reduced. Moreover, by controlling the electron beam energy, such as by application of RF power to the electrode, EBRPE is believed to provide a "softer" etch than conventional etching processes. With improved control, EBRPE is able to produce tapered etch profiles, such as etching profiles utilized in certain shallow trench isolation applications.

While the foregoing is directed to embodiments of the present disclosure, other and further embodiments of the disclosure may be devised without departing from the basic scope thereof, and the scope thereof is determined by the claims that follow.

What is claimed is:

1. A method of etching a substrate, comprising:
   positioning the substrate on a pedestal disposed in a process volume of a process chamber;
   delivering a process gas to the process volume of the process chamber;
   applying low frequency RF power to an electrode formed from a metal oxide containing material or one or more of silicon containing materials, carbon containing materials, silicon-carbon containing materials, or silicon-oxide containing materials, the electrode disposed in the process volume opposite the pedestal;
   generating a plasma comprising ions in the process volume;
   bombarding the electrode with the ions to cause the electrode to emit electrons and form an electron beam;
   accelerating the electrons emitted from the electrode through the plasma toward the substrate; and
   etching the substrate.

2. The method of claim 1, wherein the low frequency RF power has a frequency of about 2 MHz.

3. The method of claim 1, wherein the electrode is formed from one or more of silicon containing materials, carbon containing materials, silicon-carbon containing materials, or silicon-oxide containing materials.

4. The method of claim 1, wherein the electrode is formed from a metal oxide containing material.

5. The method of claim 4, wherein the metal oxide containing material is selected from the group consisting of aluminum oxide, yttrium oxide, and zirconium oxide.

6. The method of claim 1, wherein the plasma is generating by capacitive coupling.

7. The method of claim 1, wherein the process gas includes one or more of chlorine containing materials, fluorine containing materials, bromine containing materials, or oxygen containing materials.

8. The method of claim 7, further comprising:
   delivering an inert gas to the process volume with the process gas.

9. The method of claim 8, wherein the inert gas is delivered to a region of the process volume adjacent to the electrode.

10. The method of claim 1, wherein a pressure maintained within the process volume is between about 0.001 Torr and about 10 Torr.

11. The method of claim 1, wherein a negative bias is applied to the electrode.

12. The method of claim 11, wherein a bias power applied to the electrode is between about 1KW and about 10 KW with a frequency of between about 400 kHz and about 200 MHz.

13. The method of claim 1, further comprising:
   maintaining a pedestal disposed in the process volume at ground potential.

14. The method of claim 13, wherein the substrate is electrostatically chucked to the pedestal.

15. The method of claim 1, wherein the electron beam has a beam energy between about 10 eV to 20,000 eV.

16. A method of etching a substrate, comprising:
   positioning a substrate on a pedestal disposed in a process volume of a process chamber;
   biasing the pedestal while the substrate is positioned on the pedestal;
   delivering a process gas to the process volume;
   applying low frequency RF power to an electrode disposed in the process volume opposite the pedestal upon which the substrate is positioned;
   energizing the process gas to form a plasma in the process volume;
   biasing the electrode while the substrate is positioned opposite the electrode;
   accelerating ions from the plasma toward the electrode;
   generating an electron beam from electrons emitted from the electrode; and
   etching the substrate using an electron beam generated from electrons emitted from the electrode.

17. The method of claim 16, wherein the low frequency RF power has a frequency of about 2 MHz.

18. The method of claim 16, wherein the electrode is formed from one or more of a silicon containing material, a carbon containing material, silicon-carbon containing materials, silicon-oxide containing materials, an aluminum oxide material, a yttrium oxide material, a zirconium oxide material, and combinations and mixtures thereof.

19. A method of etching a substrate, comprising:
   positioning a substrate on a pedestal disposed in a process volume of a process chamber;
   electrostatically chucking the substrate to the pedestal;
   maintaining the pedestal at ground potential;
   delivering a process gas to the process volume;
   applying RF power with a frequency of about 2 MHz to an electrode disposed in the process volume opposite the pedestal;

energizing the process gas to form a plasma in the process volume;

biasing the electrode;

accelerating ions from the plasma toward the electrode;

generating an electron beam from electrons emitted from the electrode; and etching the substrate using an electron beam generated from electrons emitted from the electrode.

20. The method of claim 19, wherein the electrode is formed from one or more of a silicon containing material, a carbon containing material, silicon-carbon containing materials, silicon-oxide containing materials, an aluminum oxide material, a yttrium oxide material, a zirconium oxide material, and combinations and mixtures thereof.

* * * * *